(12) United States Patent  
Akama

(10) Patent No.: US 6,972,383 B2  
(45) Date of Patent: Dec. 6, 2005

(54) MULTILAYERED CIRCUIT BOARD

(75) Inventor: Fumio Akama, Tokyo-To (JP)

(73) Assignee: Nippon Mektron, Ltd., Tokyo-to (JP)

( * ) Notice: Subject to any disclaimer, the term of this patent is extended or adjusted under 35 U.S.C. 154(b) by 88 days.

(21) Appl. No.: 10/671,517

(22) Filed: Sep. 29, 2003

(65) Prior Publication Data

US 2004/0062019 A1    Apr. 1, 2004

(30) Foreign Application Priority Data

Oct. 1, 2002    (JP) .............................. 2002-288991

(51) Int. Cl.⁷ ........................ H05K 1/11; H01R 12/04
(52) U.S. Cl. ..................... 174/264; 174/255; 174/258; 174/262
(58) Field of Search ................ 174/255, 262, 174/254, 258, 261, 264, 256, 257, 259, 260; 361/792, 793, 794, 795, 803

(56) References Cited

U.S. PATENT DOCUMENTS 5,103,293 A * 4/1992 Bonafino et al. ........... 257/702
5,457,881 A * 10/1995 Schmidt ........................ 29/852
5,822,850 A * 10/1998 Odaira et al. .................. 29/846
5,865,934 A *  2/1999 Yamamoto et al. ......... 156/295
6,452,282 B1 *  9/2002 Kweon et al. ............... 257/783

FOREIGN PATENT DOCUMENTS

JP    02000114280 A  *  4/2000

OTHER PUBLICATIONS

Computer translation of Japanese Patent JP02000114280A.*

* cited by examiner

Primary Examiner—Kamand Cuneo  
Assistant Examiner—Ishwar I. B. Patel  
(74) Attorney, Agent, or Firm—Foley & Lardner LLP

(57) ABSTRACT

A multilayered circuit board has good imbedding properties for circuit patterns, and an interlayer insulating material having superior adhesive force and interlayer insulating properties. In a multilayered circuit board wherein interlayer connection is achieved by the contact of minute pointed protrusions, provided on a first conductive circuit layer, with a second conductive circuit layer, interlayer insulation is achieved by a film having a three-layer structure, comprising a thermoplastic film inserted between a pair of thermosetting adhesive layers.

2 Claims, 2 Drawing Sheets

MULTILAYERED CIRCUIT BOARD

BACKGROUND OF THE INVENTION

1. Field of the Invention

This invention relates to a multilayered circuit board, and in particular relates to the structure of an interlayer insulating material.

2. Description of the Related Art

One technique of interlayer connection in a multilayered circuit board comprises passing a minute pointed protrusion, which is provided on a first conductive layer, through an interlayer insulating layer and connecting it to a second conductive layer. The interlayer insulating material used in this case may, for example, comprise prepreg, that is, epoxy resin impregnated in glass cloth.

However, dust (particles or resin and/or glass) is created at the time of handling, and causes dust pollution. Further, the roughness of the glass cloth renders the interlayer insulating properties and interlayer conducting properties liable to become unstable, making it difficult to manufacture a highly precise multilayer circuit board.

Another manufacturing method has been proposed, and uses a three-layer structure of thermoplastic resin, perforated heat-resistant resin (polyimide) film, and thermoplastic resin.

However, this method increases the manufacturing cost, since the heat-resistant film must be perforated beforehand by using laser light and an NC drill.

Yet another method uses a liquid crystal polymer simple substance as the interlayer insulating material.

However, since the liquid crystal polymer must be sufficiently thick in order to ensure sufficient imbedding of the built-in pattern, the cost is increased; in addition, the loss of flexibility is an obstacle to application in multilayered flexible circuit boards.

SUMMARY OF THE INVENTION

This invention has been realized after consideration of the problems described above, and aims to provide a multilayered circuit board having good characteristics for imbedding a circuit pattern, and using an interlayer insulating material having superior interlayer adhesion and interlayer insulating properties.

In order to achieve the above objects, this invention provides a multilayered circuit board in which interlayer connection is achieved by the contact of minute pointed protrusions, provided on a first conductive circuit layer, with a second conductive circuit layer; interlayer insulation is achieved by a film having a three-layer structure, comprising a thermoplastic film inserted between a pair of thermosetting adhesive layers.

DESCRIPTION OF THE PREFERRED EMBODIMENTS

FIGS. 1A to 1E show manufacturing processes of an embodiment of this invention.

Figure 1A:
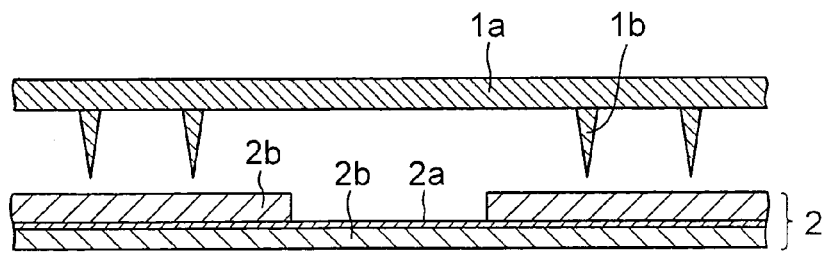
FIGS. 1A to 1E are diagrams showing manufacturing processes of an embodiment of this invention.

As shown in FIG. 1A, a great number of minute pointed protrusions $1b$ are provided on one face of a main body $1a$ of a copper foil 1, and the face of the copper foil 1 where the pointed protrusions $1b$ are provided is positioned opposite an interlayer insulating material 2 having a three-layer structure.

The three-layer structure of the interlayer insulating material 2 is achieved by providing a pair of thermosetting adhesive layers $2b$ on both sides of a thermoplastic film $2a$. The thermoplastic film $2a$ comprises a liquid crystal polymer film, and has a thickness of less than 25 um, e.g. 10 um.

By making the thermoplastic film $2a$ extremely thin in this way, the minute pointed protrusions for interlayer connection can be passed through the interlayer insulating material by a process of simple vacuum pressing or the like, which does not require a high temperature. The number of manufacturing processes is consequently reduced, since there is no need to perforate holes beforehand using a laser or an NC drill.

The thermosetting adhesive layers $2b$ comprise thermosetting resin having adhesive properties, and each has a thickness of 40 um. The central section of the thermosetting adhesive layer $2b$ on the top side of FIG. 1A is cut away, increasing its flexion in the left-to-right direction as viewed in FIG. 1A.

The interlayer insulating material 2 comprises a film material which generates very little dust, preventing the infiltration of impurities.

Figure 1B:
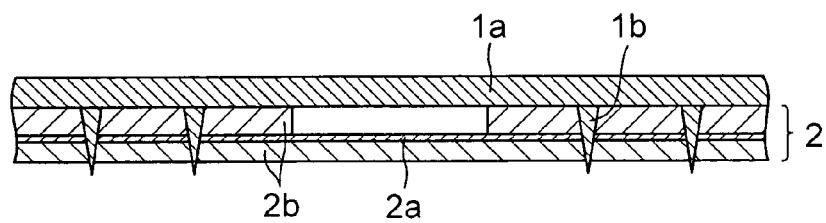

As shown in FIG. 1B, the pointed protrusions $1b$ of the copper foil 1 are pressed through the interlayer insulating material 2, and the copper foil 1 and the interlayer insulating material 2 are laid on top of each other. The thickness of the interlayer insulating material 2 is selected so that the pointed protrusions $1b$ pass through it and protrude to the other side. Therefore, the pointed protrusions $1b$ protrude from the bottom side of the interlayer insulating material 2 as viewed in FIG. 1B.

Figure 1C:
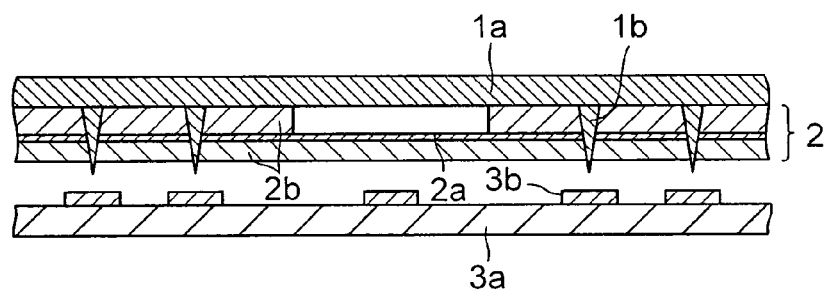

Then, as shown in FIG. 1C, a one-sided flexible circuit board 3 is provided so as to directly contact the tips of the pointed protrusions $1b$ protruding from the from the bottom side of the interlayer insulating material 2.

Figure 1D:
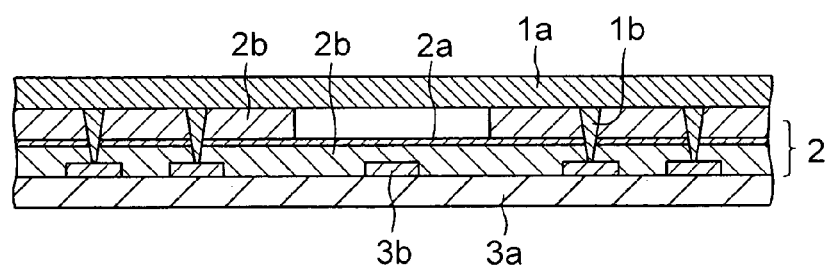

As shown in FIG. 1D, the one-sided flexible circuit board 3 directly contacts the interlayer insulating material 2 from the bottom side of FIG. 1D. The one-sided flexible circuit board 3 comprises a circuit pattern $3b$, which is provided on the top side of an insulating board $3a$, as viewed in FIG. 1D; the pointed protrusions $1b$ directly contact the circuit pattern $3b$, and connect it to the copper foil $1a$.

Figure 1E:
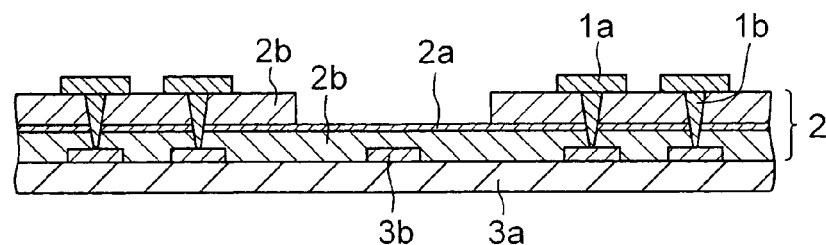

Thereafter, as shown in FIG. 1E, a circuit pattern is made by etching of the copper foil $1a$. Consequently, the circuit pattern, made by etching the copper foil $1a$, which is the uppermost layer in FIG. 1E, is connected to the circuit pattern of the one-sided flexible circuit board 3 by the pointed protrusions $1b$, obtaining a two-layer circuit board.

Figure 2:
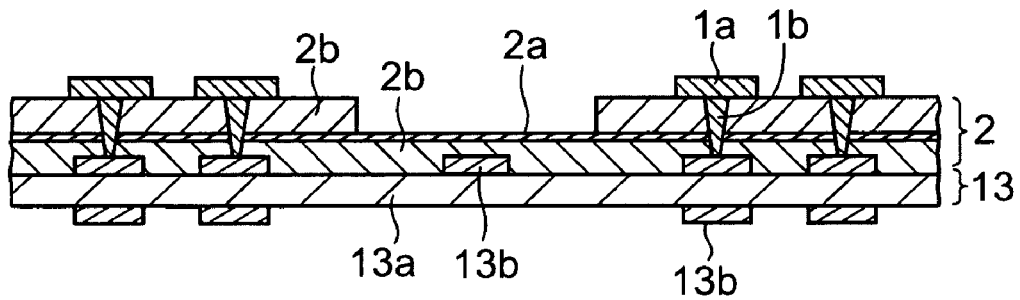
FIG. 2 is a side view of a layer structure of a second embodiment of this invention.

FIG. 2 shows a second embodiment of this invention, in which the one-sided flexible circuit board 3 of the first embodiment is replaced by a double-sided flexible circuit board 13, forming a three-layered flexible circuit board.

That is, the copper foil 1 and the interlayer insulating material 2 are the same as those in the first embodiment, while the one-sided flexible circuit board 3 is replaced by the double-sided flexible circuit board 13. After laminating the copper foil 1, the interlayer insulating material 2, and the double-sided flexible circuit board 13, a pattern is etched into the copper foil 1 to obtain the circuit pattern.

In this case, the two sides of the double-sided flexible circuit board 13 may be connected by throughhole plating, via-holes, or a minute conductive pump.

Figure 3:
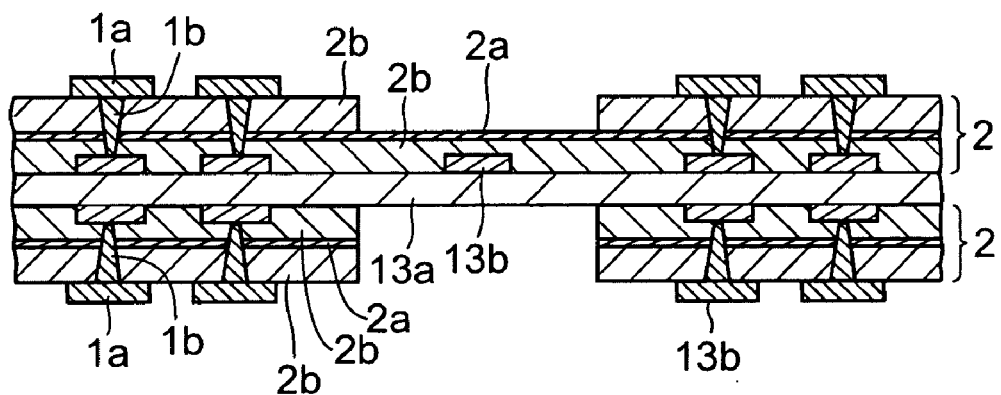
FIG. 3 is a side view of a layer structure of a third embodiment of this invention.

FIG. 3 shows a third embodiment of this invention, in which the interlayer insulating material 2 is provided on each side of the double-sided flexible circuit board 13, and copper foils 1 are provided on the exposed faces of the interlayer insulating materials 2, thereby obtaining a four-layered flexible circuit board.

That is, the constitution upwards from the double-sided flexible circuit board 13 at the center of the direction parallel to the thickness in FIG. 3 is the same as that of the second embodiment, but another interlayer insulating material 2 is added to the bottom side to form a four-layer flexible circuit board having a structure which is symmetrical from top to bottom.

In this case, the pointed protrusions 1b pass through the interlayer insulating material 2 parallel to the thickness, and connect the circuit patterns provided on both sides of the interlayer insulating material 2 parallel to its thickness, that is, they connect the first and second circuit patterns, and the third and fourth (parallel to the thickness) circuit patterns, together.

Figure 4:
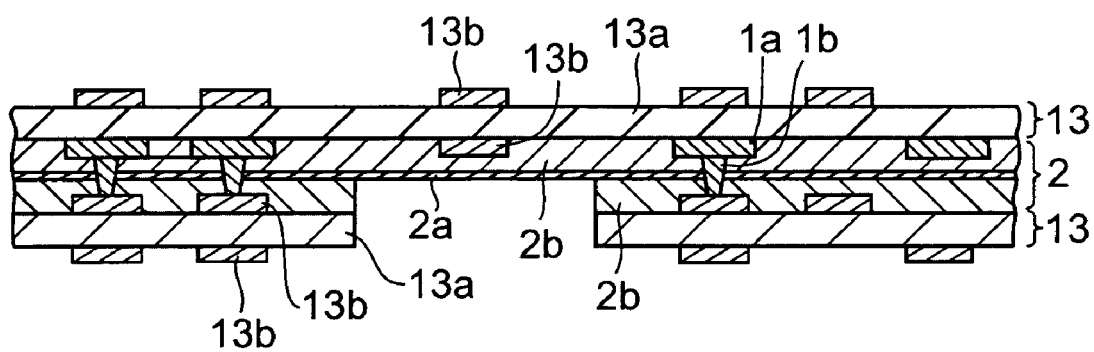
FIG. 4 is a side view of a layer structure of a fourth embodiment of this invention.

In contrast to FIG. 3, FIG. 4 shows a fourth embodiment of this invention, in which the interlayer insulating material 2 is provided at the center of the direction parallel to the thickness, and double-sided flexible circuit boards 13 are provided above and below the interlayer insulating material 2, thereby obtaining a four-layer flexible circuit board.

In this case, since the interlayer insulating material 2 is provided at the center of the thickness direction, the second and third circuit patterns of the four-layer structure are connected together. Modifications The compound layers in the embodiments described above may be given optimized thicknesses, or partially omitted, as deemed appropriate after considering the flexibility demanded by the circuit board.

The film material comprising the interlayer insulating material in the embodiments described above may be used, for example, as a cover for protecting the cable section of the flexible circuit board.

In the above embodiments, the multilayered circuit board is made by assembling the interlayer insulating material with one-sided and double-sided flexible circuit boards, but the multilayered circuit board may be made by assembling the interlayer insulating material with a rigid circuit board.

As described above, a three-layer structure, comprising a thermoplastic film inserted between thermosetting adhesive layers, is used as the interlayer insulating material in the multilayered circuit board wherein electrical connection is achieved by minute pointed protrusions, thereby making it possible to provide a multilayered circuit board having sufficient adhesive force and imbedding properties for the circuit patterns, and sufficient interlayer insulating properties and partial flexibility. Little dust pollution occurs during the manufacturing processes of the multilayered circuit board, achieving superior manufacturability.

In one embodiment of the present invention, the film having the three layer structure is characterized in that the thickness of the thermosetting adhesive layers is greater than the thickness of the opposing conductive layers.

What is claimed is:

1. A multilayered circuit board in which interlayer connection is achieved by the contact of minute pointed protrusions, provided on a first conductive circuit layer, with a second conductive circuit layer, wherein interlayer insulation is achieved by a film having a three-layer structure, comprising a thermoplastic film inserted between a pair of thermosetting adhesive layers, and wherein the film having a three-layer structure is characterized in that the thickness of the thermosetting adhesive layers is greater than the thickness of the opposing conductive layers, and the thickness of the thermoplastic film is less than 25 $\mu m$.

2. The multilayered circuit board as described in claim 1, wherein the film having a three-layer structure is characterized in that at least one of the thermosetting adhesive layer and the thermoplastic film is partially cut away.

* * * * *